United States Patent [19]

Froncisz et al.

[11] Patent Number: 4,504,788
[45] Date of Patent: Mar. 12, 1985

[54] ENCLOSED LOOP-GAP RESONATOR

[75] Inventors: Wojciech Froncisz, Krakow, Poland; James S. Hyde, Dousman, Wis.

[73] Assignee: The Medical College of Wisconsin, Inc., Milwaukee, Wis.

[21] Appl. No.: 414,642

[22] Filed: Sep. 3, 1982

[51] Int. Cl.³ .................. G01R 33/08; H03H 1/00
[52] U.S. Cl. .................. 324/316; 333/219; 333/235; 334/45
[58] Field of Search ............ 343/769; 334/41, 45; 333/185, 202, 219, 235; 324/316

[56] References Cited

U.S. PATENT DOCUMENTS

| | | |
|---|---|---|
| 2,342,896 | 2/1944 | Salzberg . |
| 2,414,280 | 1/1947 | Thomas . |
| 2,611,865 | 9/1952 | Alford ............................ 343/769 |
| 2,656,483 | 10/1953 | Apstein ........................ 333/219 X |
| 2,945,189 | 7/1960 | Rowe . |
| 2,996,610 | 8/1951 | Relis ............................ 343/769 X |
| 3,123,787 | 3/1964 | Shifrin . |
| 4,053,856 | 10/1977 | Fisher et al. . |

OTHER PUBLICATIONS

Donald R. Hamilton, "Klystrons and Microwave Triodes", MIT Radiation Laboratory Series (1948), pp. 71–91.
J. J. Hamilton, "Reflex Klystrons", *Cavity Resonators and Output Systems*, (1958), pp. 8–13.
Kazuo Fujisawa, "General Treatment of Klystron Resonator Cavities", IRE Transactions on Microwave Theory and Techniques, Oct., 1958, pp. 344–355.

*Primary Examiner*—Paul Gensler
*Attorney, Agent, or Firm*—Barry E. Sammons

[57] ABSTRACT

The ends of a loop-gap resonator are extended along a closed path to define an enclosed chamber with a gap extending along its length. A lumped circuit resonator is formed and the magnetic field is confined to the chamber. Openings may be formed in the chamber wall to direct magnetic flux through sample materials outside the chamber, and the cross sectional area of the chamber may be altered to control the energy density distribution of the magnetic field.

5 Claims, 8 Drawing Figures

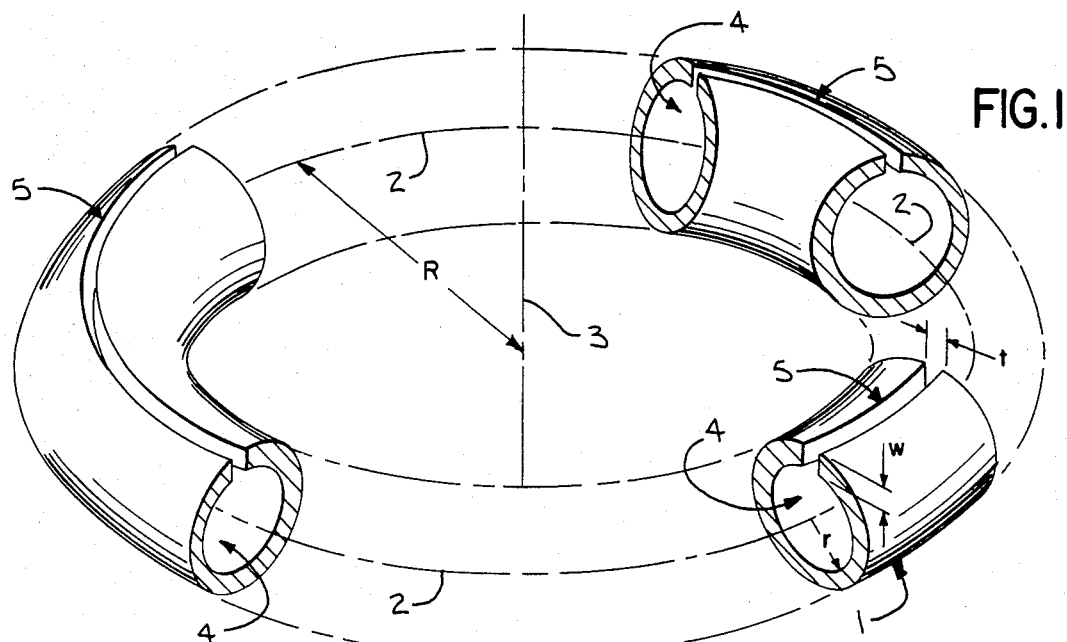
FIG. 1
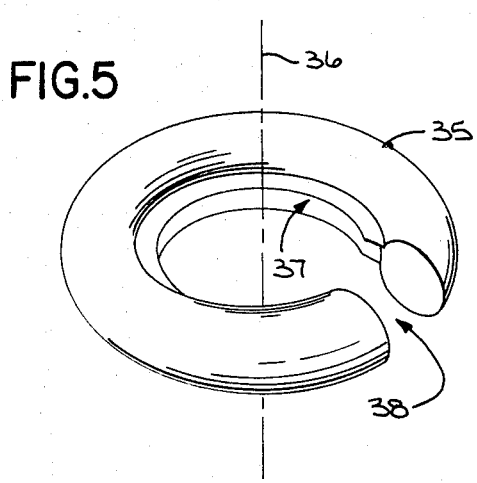
FIG. 5
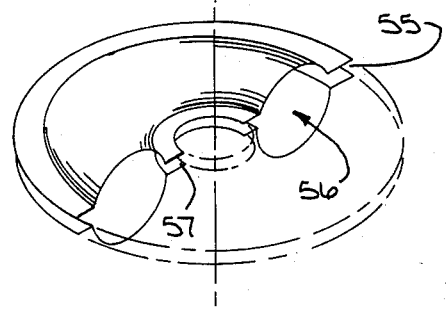
FIG. 6
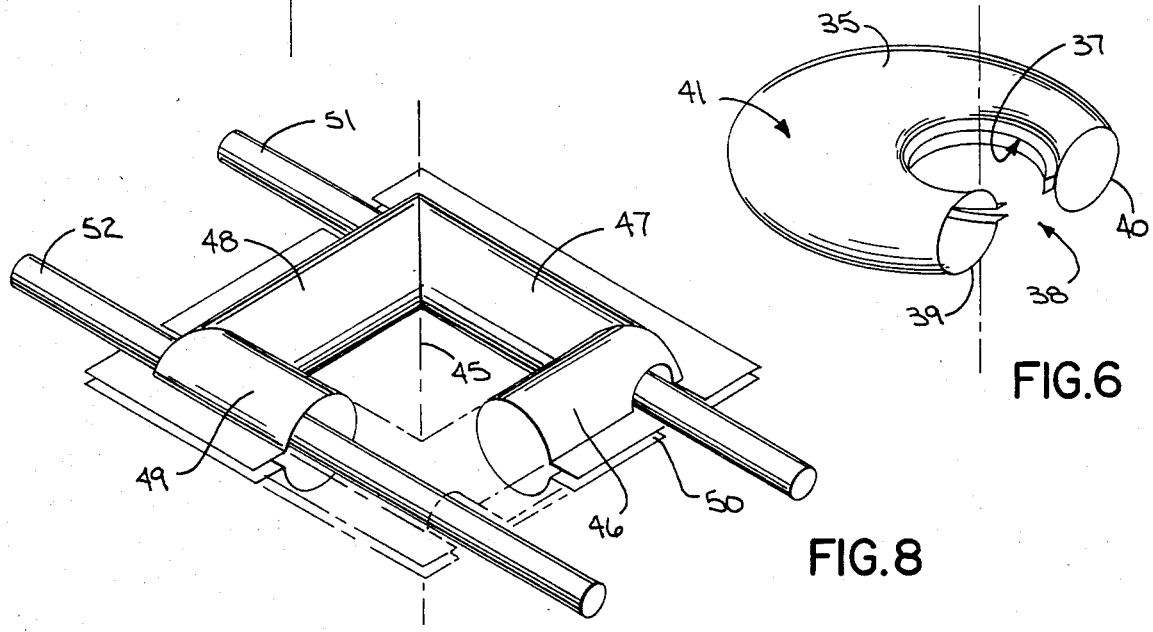
FIG. 7
FIG. 8

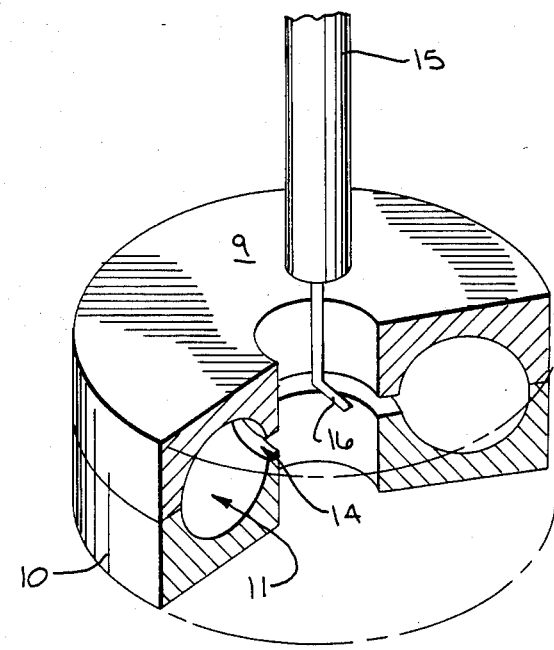
FIG. 2
FIG. 3
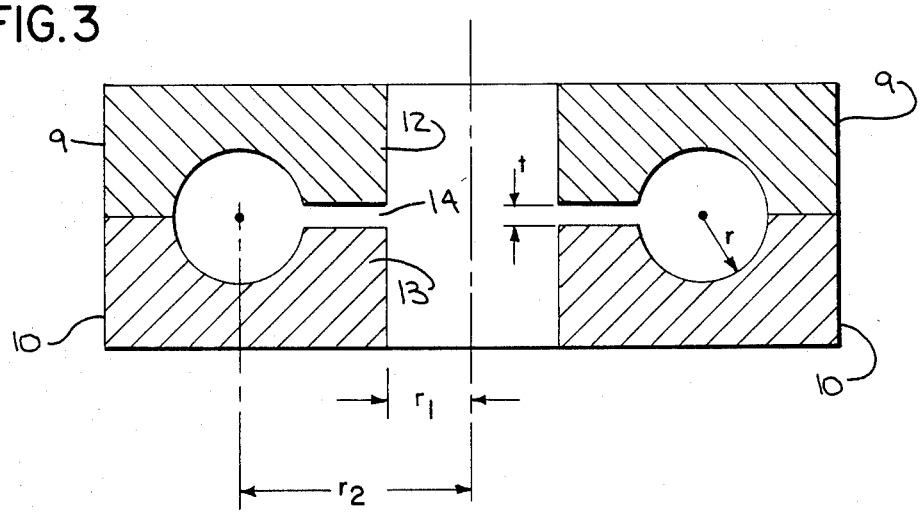
FIG. 4
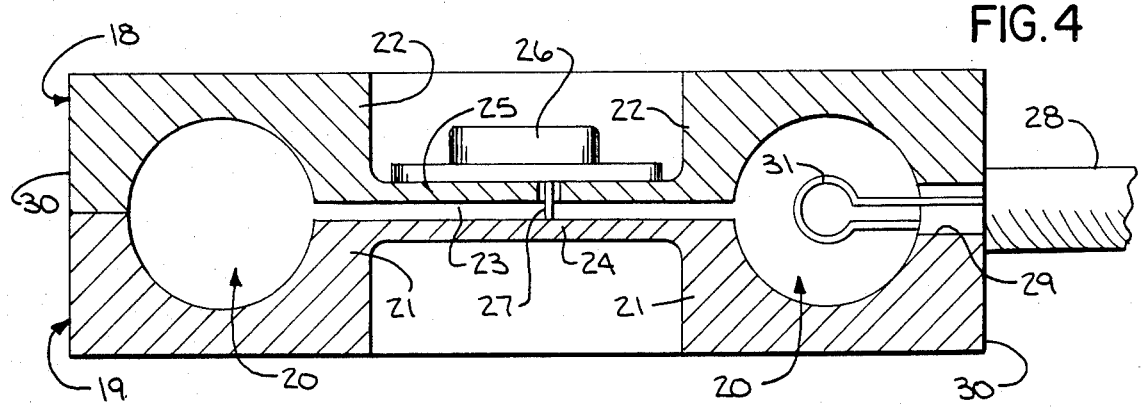

ENCLOSED LOOP-GAP RESONATOR

GOVERNMENT RIGHTS

The present invention was made in the course of work under a grant or award from the Department of Health and Human Services. This same invention was also made with Government support under grant PCM-78-23206 awarded by the National Science Foundation. The Government has certain rights in this invention.

BACKGROUND OF THE INVENTION

The field of the invention is radio frequency resonators, and particularly, resonators employed in gyromagnetic resonance spectroscopy.

Gyromagnetic resonance spectroscopy is conducted to study nuclei that have a magnetic moment, which is called nuclear magnetic resonance (NMR) and electrons which are in a paramagnetic state which is called paramagnetic resonance (EPR) or electron spin resonance (ESR). There are also a number of other forms of gyromagnetic spectroscopy that are practiced less frequently, but are also included in the field of this invention. In gyromagnetic resonance spectroscopy a sample to be investigated is subjected to a polarizing magnetic field and one or more radio frequency magnetic fields. The frequency, strength, direction, and modulation of the magnetic fields varies considerably depending upon the phenomena being studied. Apparatus such as that disclosed in U.S. Pat. Nos. 3,358,222 and 3,559,043 has been employed for performing such experiments in laboratories, but widespread commercial use of gyromagnetic resonance spectroscopy techniques has been limited.

The reason for the limited commercial application of gyromagnetic resonance spectrometers in their complexity and high cost. Very high radio frequencies are required for some measurement techniques (such as electron spin resonance measurements) and very strong polarizing magnetic fields are required for others (such as nuclear magnetic resonance). In addition, the physical structures for applying multiple fields to a specimen are complex, particularly when the temperature of the specimen is to be controlled, or the specimen is to be irradiated with light during the measurement.

A loop-gap resonator which offers many advantages over prior structures used in gyromagnetic resonance spectrometers is disclosed in our U.S. Pat. No. 4,446,429 which issued on May 1, 1984, and which is entitled "Microwave Resonator". The size of this loop-gap resonator, the number and size of the gaps which it contains and the materials from which it is constructed are variables which enable the resonator to be used in a large variety of measurements and over a wide range of frequencies.

This loop-gap resonator employs a shield which not only confines the electric and magnetic fields to the resonator but which also increases the quality factor, or Q, of the resonator. The resulting structure is generally cylindrical and is convenient for many gyromagnetic resonance measurements. On the other hand, the shield is an additional element which adds complexity and cost to the resonator structure and which limits the variety of physical configurations that are possible.

SUMMARY OF THE INVENTION

The present invention relates to an improved lumped circuit loop-gap resonator in which the shield is eliminated. More specifically, the invention is a lumped circuit resonator which is formed by a loop of electrically conductive material that extends along a central axis in a closed path about an axis of revolution and which includes a gap in its surface which extends around the axis of revolution along the entire length of the loop. The radio frequency magnetic field is substantially confined within the chamber formed by the resonator. The resonant frequency of the structure is determined by the lumped capacitance and lumped inductance and is nearly independent of the length of the structure as measured along the central axis. As a result, many different physical configurations are possible and the magnetic field can be easily confined and directed.

It was recognized in our above-cited U.S. Pat. No. 4,446,429 that the resonant frequency of the lumped circuit loop-gap resonator was independent of its length. The present invention capitalizes of this characteristic by extending the length of the loop-gap resonator along a path which closes on itself. In a preferred embodiment the enclosed path is a circle and the resulting resonator is a toroid. However, other paths are useful and may include paths which do not lie in a single plane and paths which contain higher order discontinuities.

A general object of the invention is to provide a loop-gap resonator which need not be shielded. By closing the ends of the loop-gap resonator on themselves the magnetic field generated by the resonator is substantially confined within the resonator and distributed along its length.

Another object of the invention is to control the application of the radio frequency magnetic field oscillating in the loop-gap resonator. An opening may be provided in the resonator through which sample materials to be tested may be inserted into the confined magnetic field. On the other hand, such an opening may be enlarged to allow the magnetic field to escape the confines of the resonator in a controlled pattern.

Yet another object of the invention is to control the energy density of the confined magnetic field. The energy density of the magnetic field within the resonator is inversely proportional to the square of the cross sectional area within the loop. Thus, by reducing the cross sectional area at a point within the resonator, the energy of the magnetic field can be concentrated at that point.

A more specific object of the invention is to provide a resonator which will apply a magnetic field to a plurality of samples. The samples may be positioned at different points around the closed path, and the relative energy density of the magnetic field applied to each sample is precisely determined by the cross sectional areas at the sample points.

Still another object of the invention is to provide a resonator structure which has desirable electrical qualities and convenient mechanical features. The electrical qualities can be achieved with a wide variety of mechanical shapes and thus the particular shape which is employed may be determined for the most part by the mechanical constraints of the application.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 1 is a perspective view of a general embodiment of the invention with parts cut away;

FIG. 2 is a perspective view with part cut away of a first preferred embodiment of the invention;

FIG. 3 is a schematic view in cross section of the resonator of FIG. 2;

FIG. 4 is a view in cross section of a second preferred embodiment of the invention;

FIGS. 5 and 6 are perspective views of two other embodiments of the invention; and FIGS. 7 and 8 are perspective views with parts cut away of two further embodiments of the invention.

DESCRIPTION OF THE PREFERRED EMBODIMENTS

Referring to FIG. 1, a generalized embodiment of the invention is shown in which a loop 1 made of an electrically conductive material is extended in length along a closed path indicated by central axis 2. The closed path encircles an axis of revolution 3 and the ends of the loop 1 connect with each other to form a completely enclosed resonator chamber 4. A gap 5 is formed in the loop 1 and this gap 5 extends around the axis of revolution along the entire length of the chamber 4.

The resonator of FIG. 1 is a lumped circuit resonator which resonates at a radio frequency determined by certain aspects of its geometry. In contrast to distributed circuit cavity resonators, the lumped circuit resonator of the present invention has dimensions which are much less than the wavelength of the radio frequency at which it resonates. An additional characteristic of this lumped circuit resonator is that the capacitive and inductive elements are identifiable and the electromagnetic energy oscillates between a magnetic field existing in the inductive loop element 1 and an electric field existing in the capacitive gap element 5.

The resonant frequency of the resonator of the present invention is given by the following equation:

$$F = 1/(2\pi \sqrt{LC}) \quad (1)$$

where:
L = inductance of the resonator
C = capacitance of the resonator

The inductance (L) of the resonator in FIG. 1 is given by the following general formulas:

$$L = \phi/I, \text{ where: } \phi = \text{magnetic flux and } I = \text{current} \quad (2)$$

If the size of the loop 1 remains constant along the entire length of the resonator, and the closed path is a circle, the inductance is as follows:

$$L = \mu_o(R - \sqrt{R^2 - r^2}) \quad (3)$$

The capacitance (C) of the resonator in FIG. 1 is given by the following general formulas:

$$C = Q/V \quad (4)$$

where:
Q = charge on capacitor
V = potential difference between plates

If the size of the gap 5 is constant along its entire length, the capacitance is given by the following:

$$C = \epsilon WM/t \quad (5)$$

where:
$\epsilon$ = the dielectric constant of the material in the gap 5.
M = the length of the gap 5.
t = gap spacing (FIG. 1)
W = gap width (FIG. 1)

The resonant frequency of the structure of FIG. 1 is given by the following formula when the size and shape of its loop 1 and gap 5 remain constant along its entire length:

$$F = \tfrac{1}{2}\pi \sqrt{\mu_o \epsilon WM(R - \sqrt{R^2 - r^2})/t} \quad (6)$$

More than one gap may be formed in the loop to provide the desired resonant frequency according to the teaching of our prior co-pending patent application, and the gap can be located at any point on the circumference of the loop.

In its most general form, the resonator of FIG. 1 need not lie in a signal plane. Similarly, the shape of the loop 1 need not be circular, although this appears to be the most useful shape. The resonator may be constructed from a metal such as brass and plated with a better conductor such as silver, or it may be constructed from a non-conductive material which has a conductive metal layer deposited over its surface as described in our U.S. Pat. No. 4,435,680 and which is entitled "Microwave Resonator Structure".

Referring particularly to FIGS. 2 and 3, a first preferred embodiment of the invention is constructed from two disc-shaped silver plated brass sections 9 and 10. The two sections 9 and 10 define a toroidal shaped chamber 11 which forms the loop of the resonator, and inner lips 12 and 13 of the two sections 9 and 10 are spaced apart to form the resonator gap 14. Energy is applied to the resulting resonator through a coaxial cable 15 which has its center lead 16 disposed adjacent the gap 14. Energy is thus coupled to the resonator through the electric field which is concentrated at the gap 14, and the structure resonates at a frequency given by the following formula:

$$F = \pi^{-3/2}(C/2) \sqrt{t/\epsilon_1[(r_2 - r)^2 - r_1^2][r_2 - \sqrt{r_2^2 - r^2}]} \quad (7)$$

where:
C = speed of light
$\epsilon_1$ = relative dielectric constant

Table A provides a list of dimensional values for the resonator of FIGS. 1 and 3, along with the calculated resonant frequency, the measured resonant frequency and quality factor (Q).

TABLE A $r_1 = 5.62 \pm 0.02$ millimeters
$r = 3.39 \pm 0.07$ millimeters
$r_2 = 11.08 \pm 0.1$ millimeters
$t = 0.076 \pm 0.01$ millimeters
F (calculated) = 1.94 GHz
F (measured) = 2.068 GHz
Q = 1880

Referring particularly to FIG. 4, a second preferred embodiment of the resonator is also comprised of two disc-shaped sections 18 and 19 which define a toroidal-shaped resonator chamber 20. In this embodiment inner lips 21 and 22 are spaced apart to form the capacitive gap 23 and the lips 21 and 22 are extended radially inward to form spaced mounting walls 24 and 25. An active electronic component 26 is mounted to the wall 25 and one of its elements is electrically connected to wall 24 by a pin 27. The electronic component 26 may be a semiconductor switch which is connected to short circuit the capacitor element. In this manner the resonator can be switched on and off by an input signal applied to the semiconductor switch's control element. The electronic component 26 may also be a varactor which is responsive to an input signal to vary the capacitance across the gap 23 and to thereby control the resonant frequency of the structure. The electronic component 26 may also be a solid state device which forms an oscillator or an amplifier and the resonator structure serves as its associated resonant tank circuit.

Referring still to FIG. 4, in contrast to the first preferred embodiment, energy is magnetically coupled to this version of the resonator through its magnetic field. This is accomplished by a coaxial cable 28 which connects to an opening 29 in the outer wall 30 of the resonator. The center lead wire in the cable 28 extends into the resonator chamber 20 where it is formed into a loop 31. The magnetic field is concentrated in the chamber 20 and magnetic energy may be added to this field or removed from it by the loop 31.

Referring particularly to FIGS. 5 and 6, the resonator of the present invention may be employed as a means for directing radio frequency magnetic energy onto a subject positioned outside the loop. In FIG. 5, a toroidal-shaped resonator is formed by a loop 35 which extends in a circular path about an axis of revolution 36. A gap 37 is formed around the inner periphery of the loop 35 and a segment of the loop is removed at 38. Energy may be coupled to the resonator using either of the structures described above, and this energy will oscillate between the electric field which is concentrated in the gap 37 and the magnetic field which is uniformly dispersed throughout the toroidal chamber. This magnetic field appears with almost equal strength in the space formed by the removed segment 38.

The embodiment of FIG. 6 is the same in many respects to that of FIG. 5 and its elements have been identified with the same reference numbers. There are, however, two important differences. The space 38 in the loop 35 is formed by a "planar" cut which enables the exposed ends 39 and 40 to be positioned adjacent a flat surface. The magnetic field which flows between the ends 39 and 40 is thus directed into the flat surface and the resonator of FIG. 6 is thus particularly useful for scanning relatively large surface areas.

The embodiment of FIG. 6 also employs an additional advantage of the present invention. The cross sectional area of the loop 35 is significantly smaller at its ends 39 and 40 than at its mid-portion 41. The magnetic flux is constant through any cross sectional area (A) around the path of the resonator loop 35, and the flux density (B) is thus inversely proportional to the area (A). Because the magnetic field energy density is proportional to the square of flux density ($B^2$), the magnetic field energy density is inversely proportional to the square of the cross sectional area (A) of the resonator chamber. Thus, the sensitivity of gyromagnetic spectrometers may be increased by decreasing the cross sectional area of the loop gap resonator at the point where the sample under test is positioned. In the embodiment of FIG. 6, the sample under test is placed adjacent the exposed ends 39 and 40 and the loop 35 at these points has minimal cross sectional area to increase the magnetic energy density in the sample.

The principles employed in FIG. 6 to concentrate the magnetic field energy at the sample under test may also be employed to control the relative energy densities applied to a plurality of samples under test. This is particularly useful when comparing two separate sample materials using gyromagnetic measurement techniques.

Referring particularly to FIG. 8, a resonator is formed by extending the loop along a rectangular path about an axis of revolution 45. The resonator chamber thus formed is divided into four distinct sections 46–49 which intersect each other at right angles. A single gap 50 is formed around the outer perimeter of the resonator and these elements are dimensioned to provide the desired resonant frequency. Openings are formed in the ends of the chambers 47 and 49 and tubes 51 and 52 containing separate sample materials are inserted through these openings. The sample tube 51 is thus disposed within the chamber 47 and the sample tube 52 is disposed within the chamber 49. As indicated above, the magnetic flux is the same in all four chamber sections 46–49 and the relative energy density in each section 46–49 is inversely proportional to the square of its cross sectional area. The magnetic field energy can thus be concentrated in the samples by reducing the sizes of the chamber sections 47 and 49 relative to the chamber sections 46 and 48. In addition, the relative magnetic energy density applied to each sample can be precisely determined by the sizes of the chambers 47 and 49 in which they reside.

As indicated above, more than one gap may be employed in the resonator of the present invention. Referring to FIG. 7, a two-gap resonator is shown in which a first gap 55 is formed around the outer perimeter of a toroidal-shaped chamber 56, and a second gap 57 is formed around its inner perimeter. The capacitances $C_1$ and $C_2$ of the respective gaps 55 and 57 are each calculated using equation (5) described above. The total capacitance for use in the resonant frequency equation (1) is calculated as follows:

$$\frac{1}{C} = \frac{1}{C_1} + \frac{1}{C_2} + \ldots \frac{1}{C_n}$$

Electronic components of various kinds as discussed above in connection with FIG. 4 can be placed in one or more of these gaps. For example, if an electronic switch is mounted in one of a plurality of gaps and is energized to short circuit the gap, the resonant frequency of the structure can be switched under electronic control between two different frequencies.

While the resonator of the present invention has particular application to gyromagnetic spectroscopy, it is also applicable in the fields of communications and radar. Reference is therefore made to the following claims for a definition of the scope of the present invention.

What is claimed is:

1. A lumped circuit resonator for applying magnetic flux to a sample material which comprises:

a chamber formed by extending a conductive loop along a closed path which encircles an axis of revolution;

a gap formed in the conductive loop and extending along its entire length around the axis of revolution;

wherein the loop forms a lumped inductive element and the gap forms a lumped capacitive element which resonate when electromagnetic energy is coupled thereto to produce a magnetic flux which flows in the chamber along the closed path, and in which an opening is formed in the loop to enable magnetic flux contained within the chamber to flow outside the chamber over a portion of the path around the axis of revolution for application to the sample material.

2. The lumped circuit resonator as recited in claim 1 in which the cross sectional area of the chamber varies as a function of distance along the closed path to control the distribution of the energy of the magnetic field in the chamber.

3. A lumped circuit resonator for applying magnetic flux to a sample material which comprises:

a chamber formed by extending a conductive loop along a closed path which encircles an axis of evolution;

wherein the loop forms a lumped inductive element and the gap forms a lumped capacitive element which resonate when electromagnetic energy is coupled thereto to produce a magnetic flux which flows in the chamber along the closed path, and in which a first sample material is disposed in a first section of the chamber and a second sample material is disposed in a second section of the chamber, and the cross sectional areas of the first and second sections of the chamber are selected to establish the relative energy densities of the magnetic field applied to the respective first and second samples.

4. A lumped circuit resonator which comprises:

an inductive element formed as a conductive wall which extends around an axis of revolution to define on the inner side of the conductive wall a toroidal shaped chamber;

a capacitive element formed as a plurality of gaps in the conductive wall which gaps extend in respective closed paths completely around the axis of revolution;

wherein the resonant frequency of the resonator is determined by the value of the lumped inductance of the inductive element and by the value of the lumped capacitance of the capacitive element; and in which an electronic component is connected across one of the gaps and is electronically operable to shunt its capacitance to thereby alter the resonant frequency of the resonator.

5. A lumped circuit resonator which comprises:

a chamber formed by extending a conductive loop in a lengthwise direction along a closed path which encircles an axis of revolution;

a pair of gaps formed in the conductive loop and each extending along the entire length of the conductive loop in respective closed paths around the axis of revolution;

wherein electromagnetic energy coupled to the lumped circuit resonator produces a magnetic flux flowing in the chamber along its length and the loop forms the lumped inductive element and the gaps each form lumped capacitive elements for determining the resonant frequency of the resonator; and in which an electronic component is connected across one of the gaps and is electronically operable to shunt its capacitance to thereby alter the resonant frequency of the resonator.

* * * * *